United States Patent [19]

Ohgishi et al.

[11] 4,179,628

[45] Dec. 18, 1979

[54] FLIP-FLOP HAVING RESET PREFERENTIAL FUNCTION

[75] Inventors: Tsutomu Ohgishi, Hirakata; Toru Akiyama; Tadashi Sakurai, both of Neyagawa, all of Japan

[73] Assignee: Sanyo Electric Co., Ltd., Moriguchi, Japan

[21] Appl. No.: 853,584

[22] Filed: Nov. 21, 1977

[30] Foreign Application Priority Data

May 13, 1977 [JP] Japan .................................. 52-55614
May 17, 1977 [JP] Japan .................................. 52-57188

[51] Int. Cl.$^2$ ..................... H03K 3/286; H03K 3/353; H03K 5/20; H03D 13/00
[52] U.S. Cl. .................................... 307/279; 307/205; 307/232; 307/247 R; 307/291
[58] Field of Search ............... 307/205, 215, 232, 279, 307/289, 291, 247 R; 328/133

[56] References Cited

U.S. PATENT DOCUMENTS

| 3,710,140 | 1/1973 | Volmerange | 307/232 X |
| 3,812,384 | 5/1974 | Skorup | 307/279 X |
| 3,892,985 | 7/1975 | Kawagoe | 307/279 |
| 3,976,949 | 8/1976 | Hepworth | 307/279 X |
| 3,983,496 | 9/1976 | Bedford et al. | 307/232 X |
| 3,986,128 | 10/1976 | Eriksson et al. | 328/133 |
| 4,011,465 | 3/1977 | Alvarez, Jr. | 307/232 X |
| 4,024,416 | 5/1977 | Fujita et al. | 307/232 X |
| 4,105,947 | 8/1978 | Crowley | 307/232 X |
| 4,122,405 | 10/1978 | Tietz et al. | 307/232 X |

Primary Examiner—Larry N. Anagnos
Attorney, Agent, or Firm—Darby & Darby

[57] ABSTRACT

A flip-flop having a reset preferential function, comprising a set input terminal, a reset input terminal, a clock signal source operatively coupled through a field effect transistor to the set input terminal, a capacitance formed at the gate electrode of the field effect transistor, a charge control transistor controllable responsive to the clock signal for precharging the capacitance prior to the clock signal, a discharge control transistor controllable responsive to the reset signal for discharging the capacitance, whereby the capacitance is precharged prior to the clock signal and is discharged responsive to the reset signal, the field effect transistor being rendered conductive as a function of the electric charge of the capacitance, the clock signal source being operatively coupled to the set input terminal as a function of the conduction state of the field effect transistor, whereby the flip-flop is set responsive to the leading edge of the clock signal and is reset responsive to the reset signal in preference to the clock signal.

19 Claims, 22 Drawing Figures

FLIP-FLOP HAVING RESET PREFERENTIAL FUNCTION

BACKGROUND OF THE INVENTION

1. Field of the Invention

The present invention relates to a flip-flop having a modified function. More specifically, the present invention relates to a flip-flop having a reset preferential function, particularly suited for implementation by an integrated circuit.

2. Description of the Prior Art

As well known, flip-flops are utilized as one of the most fundamental elements of a logic circuit in implementing various digital processing circuitry. Various types of flip-flops have been proposed depending on applications. Some applications require a flip-flop having a modified function. For example, a phase comparator for comparing the phases of two digital input signals can be implemented by using a pair of flip-flops having a reset preferential function, as to be more fully described subsequently. As well known, a flip-flop typically comprises set and reset input terminals, and set and reset output terminals. As briefly described previously, in a certain application, a flip-flop is desired wherein the flip-flop is set responsive to the edge, such as the leading edge, of a clock signal to be applied to the set input terminal but is forcibly or preferentially reset responsive to the reset signal to be applied to the reset input terminal. In the light of the modified function of such a flip-flop, the flip-flop may be referred to as "a flip-flop having a reset preferential function". A flip-flop having a reset preferential function may be advantageously utilized in implementing a phase comparator for comparing the phases of two digital input signals.

FIG. 1 shows a logical diagram of an example of a flip-flop structured such that the same is set responsive to the leading edge of a clock signal to be applied to the set input terminal of the flip-flop but is preferentially or forcibly reset responsive to a reset signal to be applied to the reset input terminal of the flip-flop. The flip-flop shown in FIG. 1 comprises a first flip-flop unit F1 implemented by cross connected paired NOR gates G1 and G2, a second flip-flop unit F2 implemented by cross connected paired NOR gates G3 and G4, a NOR gate G5 and an inverter IV. The reset inputs of the flip-flop units F1 and F2 comprising one input of the NOR gates G1 and G3 are connected to the reset input terminal RE. The set input of the flip-flop F1 comprising one input of the NOR gate G2 is connected to the output of the NOR gate G5. The NOR gate G5 is connected to receive the reset output comprising the output of the NOR gate G4 of the flip-flop unit F2 and the output of the inverter IV. The set input of the flip-flop unit F2 comprising one input of the NOR gate G4 is connected to receive the output of the inverter IV. The input of the inverter IV is connected to the set input terminal CL adapted to receive a clock signal. The reset output of the flip-flop F2 comprising the output of the NOR gate G4 is also applied to another input of the NOR gate G1 of the flip-flop F1. The set output of the flip-flop unit F1 is connected to a set output terminal and the reset output of the flip-flop F1 is connected to a reset output terminal.

Referring to FIG. 1, the FIG. 1 flip-flop comprises the basic flip-flop unit F1 adapted to be responsive to the clock signal to be applied to the set input terminal of the flip-flop F1 and to be responsive to the reset signal to be applied to the reset input terminal of the flip-flop F1, which basic flip-flop unit F1 is accompanied by the additional flip-flop unit F2, which is set responsive to the inversion of the clock signal applied to the clock input terminal CL and reset responsive to the reset input signal applied to the reset input terminal RE, which reset output obtainable from the NOR gate G4 of the flip-flop unit F2 is applied to the NOR gate G5 to disable the transfer path of the clock signal comprising the inverter IV and the NOR gate G5. As a result, a desired reset preferential function can be achieved. Even if the reset signal once applied to the reset input terminal RE is interrupted, the flip-flop unit F2 keeps a reset state. Therefore, even if in such a situation the clock signal is kept applied, the fact that the clock signal is kept applied is disabled by the NOR gate G5, with the result that only the leading edge of the clock signal is effective to the set input terminal of the first flip-flop unit F1. Thus, a desired function of being responsive to only the leading edge of a clock signal to be applied to the set input terminal can be achieved. As seen from FIG. 1, the FIG. 1 flip-flop comprises five NOR gates and one inverter.

FIG. 2 shows a schematic diagram of the FIG. 1 flip-flop implemented by an integrated circuit comprising insulated gate field effect transistors. Referring to FIG. 2, the corresponding portions have been denoted by the same reference characters. It would be appreciated that the inverter is implemented by an insulated gate field effect transistor serving as a switching transistor which is connected in series with another insulated gate field effect transistor serving as a load resistor and the NOR gates are each implemented by a parallel connection of two or three insulated gate field effect transistors serving as a switching transistor which is connected in series with another insulated gate field effect transistor serving as a load resistor, as well known. As seen from FIGS. 1 and 2, the FIG. 1 flip-flop is implemented by a relatively large number of insulated gate field effect transistors, which degrades the scale of integration in implementing the flip-flop in an integrated circuit and also degrades the speed of operation.

FIG. 3 shows a logical diagram of another example of a flip-flop structured such that the same is set responsive to the leading edge of the clock signal to be applied to the set input terminal and is preferentially reset responsive to the reset signal applied to the reset input terminal. Referring to FIG. 3, the FIG. 3 flip-flop comprises a flip-flop unit F11 comprising a cross connection of paired NOR gates G12 and G13. The reset input terminal RE comprises one input of the NOR gate G13. The set input terminal comprising one input of the NOR gate G12 connected to receive the output of a NOR gate G11 one input of which is connected directly to the output of an inverter I1 and the other input of which is connected through a series connection of inverters I2, I3, and I4 to the output of the inverter I1. The input of the inverter I1 is connected to the clock terminal CL. The output of the NOR gate G13 is connected to the set output Q and through an inverter I5 to the reset output $\overline{Q}$. Referring to FIG. 3, since an inversion of the clock is directly applied to one input of the NOR gate G11 and the inversion of the clock is applied through the three inverters I2, I3 and I4 to another input of the NOR gate G11, the NOR gate G11 proves to receive an inverted clock and a non-inverted but delayed clock as delayed through the three inverters I2, I3 and I4. As a result, the NOR gate G11 provides a pulsive output which corresponds to the leading edge of the clock signal. Thus, the flip-flop shown in FIG. 3 is made responsive to the leading edge of the clock to be set. On the other hand, the reset input terminal of the flip-flop unit F11 is directly connected to the reset input terminal RE. The fact that the set input terminal of the flip-flop unit F11 is supplied with a pulsive input representative of the leading edge of the clock signal and the reset input terminal of the flip-flop unit F11 is supplied directly with the reset signal makes the FIG. 3 flip-flop responsive to the leading edge of the clock signal to be set and responsive to the reset signal to be preferentially reset.

As seen from FIG. 3, the FIG. 3 flip-flop has been implemented using a similar large number of logical components. This can be better understood by referring to FIG. 4, which shows a schematic diagram of the FIG. 3 flip-flop. Referring to FIG. 4, the corresponding portions have been denoted by the same reference characters. It would be appreciated that the inverters are each implemented by a series connection of an insulated gate field effect transistor serving as a switching device and another insulated gate field effect transistor serving as a load resistor, and the NOR gates are implemented by a parallel connection of insulated gate field effect transistors serving as a switching device and another insulated gate field effect transistor connected in series with the said parallel connection serving as a load resistor. The flip-flop as shown in FIGS. 3 and 4 again suffers from the disadvantages that the same requires many circuit components such as insulated gate field effect transistors, which degrades the scale of integration in implementing the flip-flop in an integrated circuit and also degrades the speed of operation.

As described previously, a flip-flop structured such that the same is set responsive to the leading edge of the clock signal and is preferentially reset responsive to the reset input signal may be advantageously utilized in implementing a phase comparator for comparing the phases of two digital input signals. Since a digital type phase comparator makes a phase comparison responsive to the edges of digital signals, several advantages result that the duty cycle of the digital input signals does not matter, that much less malfunction occurs by virtue of the harmonics of the input signals, that if a phase lock loop is implemented by the use of such flip-flops the capture range and the lock range of the phase lock loop extend throughout the range where the voltage control oscillator is operable, and so on. For these reasons, of late a digital phase comparator is advantageously utilized in a phase lock loop of a frequency synthesizer implemented in an integrated circuit.

FIG. 5 shows a block diagram of an example of a conventional digital type phase comparator employing flip-flops having a reset preferential function. Such a phase comparator as shown in FIG. 5 is seen in U.S. Pat. No. 3,714,463. Referring to FIG. 5, the phase comparator shown comprises a pair of flip-flops FA and FB having a reset preferential function. The clock input terminal CA of the flip-flop FA is supplied with a reference signal having a reference frequency and phase. The clock input terminal CB of the flip-flop FB is supplied with a signal being compared of the frequency and phase. The reset outputs $\overline{QA}$ and $\overline{QB}$ of the flip-flops FA and FB are applied to a NOR gate GE. The output Z of the NOR gate GE is applied to the reset input terminals RA and RB of the flip-flops FA and FB. The output Z of the NOR gate GE is also applied to one input of NOR gates GC and GD. The reset output $\overline{QA}$ of the flip-flop FA is also applied to another input of the NOR gate GC. The reset output $\overline{QB}$ of the flip-flop FB is also applied to another input of the NOR gate GD. The output X of the NOR gate GC and the output Y of the NOR gate GD are withdrawn as the outputs representing the phase difference between the reference signal and the signal being compared. As described previously, the flip-flops FA and FB are set responsive to the leading edge of the clock signals applied as a reference signal and a signal being compared to the input terminals CA and CB, whereby the set outputs QA and QB of the flip-flops FA and FB become the high level and the reset outputs $\overline{QA}$ and $\overline{QB}$ become the low level, and the flip-flops FA and FB are preferentially reset responsive to the reset signal applied to the reset input terminal RA and RB, whereupon the set output QA and QB become the low level and the reset outputs $\overline{QA}$ and $\overline{QB}$ become the high level, which reset state is kept until the following leading edge of the clock signal.

The opertion of the FIG. 5 phase comparator can be better understood with reference to FIG. 6 which shows wave forms of the signals at various portions in the FIG. 5 diagram, wherein each wave form has been identified by the same reference character as used in the FIG. 5 diagram. Referring to FIG. 6, first let it be assumed that in the time period TA the reference signal CA and the signal being compared CB are both in the low level, the flip-flops FA and FB both have been reset, whereby the reset outputs $\overline{QA}$ and $\overline{QB}$ are in the high level, and thus the outputs X, Y and Z of the NOR gates GC, GD and GE are in the low level. If and when the reference signal CA turns from the low level to the high level in such a situation, the flip-flop FA is set and the reset output $\overline{QA}$ turns from the high level to the low level. As a result, the output X of the NOR gate GC turns from the low level to the high level. The time period of such a state has been identified as a time period TB. At the end of the time period TB, the reference signal CA turns from the high level to the low level. However, no change occurs in the storing state. The time period in such a state has been identified as a time period TC. If and when the signal being compared CB turns from the low level to the high level at the beginning of the following time period TD, the flip-flop FB is set and accordingly the reset output $\overline{QB}$ of the flip-flop FB turns from the high level to the low level. At the same time, the output Y of the NOR gate GD is about to turn from the low level to the high level. At the same time, however, the output Z of the NOR gate GE is also about to turn from the low level to the high level. Therefore, the output Y of the NOR gate GD is immediately brought to the low level. Thus, the NOR gate GD is caused to provide a pulsive output corresponding to one transition. Since the output Z of the NOR gate GE has become the high level, the flip-flops FA and FB both are reset, whereby the reset outputs $\overline{QA}$ and $\overline{QB}$ of the flip-flops FA and FB turn from the low level to the high level. As a result, the output X of the NOR gate GC turns from the high level to the low level. Since the flip-flops FA and FB have been reset and the reset outputs $\overline{QA}$ and $\overline{QB}$ have become the high level, the output Z of the NOR gate GE turns from the high level to the low level. At the beginning of the following time period identified as TE, the signal being compared CB turns from the high level to the low level. However, no change occurs in the storing state. Referring to FIG. 6, it would be appreciated that two clock signals CA and CB were applied to the terminal CA and CB of the FIG. 5 circuit, wherein the clock signal CA has been advanced by a given phase difference with respect to the clock signal CB, and an output pulse X representative of the phase difference between the leading edges of the clock signals CA and CB was provided. It would be further appreciated that in view of a symmetrical circuit configuration of the FIG. 5 phase comparator, if the clock signal CB had been advanced by a given phase difference with respect to the clock signal CA, then an output pulse Y representing the phase difference between the leading edges of the clock signals CA and CB would have been obtained from the NOR gate GD.

FIG. 7 shows a schematic diagram of the FIG. 5 phase comparator, wherein the flip-flop FA and FB have been implemented by another circuit configuration having a reset preferential function. In the FIG. 7 diagram, the corresponding portions have been denoted by the same reference characters. A terminal DT is a data input and terminals DA and DB are the data input terminals of the flip-flops FA and FB. If and when the FIG. 7 diagram is implemented in an integrated circuit using insulated gate field effect transistors, transistors as many as 45 are required. Such a large number of insulated gate field effect transistors are not preferred in implementing a phase comparator in an integrated circuit form.

The example as shown in FIGS. 5 and 7 can be simplified to some extent by simply omitting the NOR gates GC and GD in the FIGS. 5 and 7 diagram and by directly withdrawing the reset outputs $\overline{QA}$ and $\overline{QB}$ of the flip-flops FA and FB as the phase difference outputs X and Y. In such a modified example, however, it has been found that a pulsive output Y as shown in FIG. 6 in case where the clock signal CA is advanced as compared with the clock signal CB becomes larger in the pulse width, which makes it difficult to descriminate the phase difference output from an undesired pulsive output and thus degrades the sensitivity of the phase comparator. Nevertheless, merely a few number of circuit components can only be reduced. Thus, such a modified example still suffers from the advantages that a relatively large number of insulated gate field effect transistors are required in implementing a desired phase comparator in an integrated circuit and the speed of operation is not sufficiently high.

Another example of a digital type phase comparator of interest is seen in the U.S. Pat. No. 3,610,954. FIG. 8 shows a logical diagram of such a digital type phase comparator of interest disclosed in the above referenced U.S. Pat. No. 3,610,954. Referring to FIG. 8, the terminal REF is supplied with a reference signal, a terminal SIG is supplied with a signal being compared, and the terminals X and Y are those for withdrawing the phase difference outputs. The operation of the FIG. 8 phase comparator is similar to that of the FIG. 5 phase comparator but can be fully understood when the above referenced U.S. Patent is referred to. FIG. 9 shows a schematic diagram of the FIG. 8 example implemented in an integrated circuit using insulated gate field effect transistors, wherein the corresponding portions have been denoted by the same reference characters. As readily understood from the FIG. 9 illustration, since the circuit configuration of the FIGS. 8 and 9 example is rather complicated, a broader area is required for implementation in an integrated circuit, which increases a stray capacitance and causes a delay of signals and thus lowers the sensitivity of a phase comparator.

SUMMARY OF THE INVENTION

Briefly described, the present invention comprises a flip-flop having set and reset input terminals, field effect switching means having a gate electrode and coupled to said set input terminal, capacitance means coupled to said gate electrode of said field effect switching means, set signal source means coupled through said field effect switching means to said set input terminal for providing a set signal to said set input terminal as a function of the conduction state of said field effect switching means determinable as a function of the electric charge in said capacitance means, reset signal source means coupled to said reset input terminal for providing a reset signal to said reset input terminal, and charging/discharging control means coupled to said capacitance means and operatively associated with said set signal for precharging said capacitance means prior to said set signal and operatively associated with said reset signal for discharging said capacitance means, whereby said flip-flop is set responsive to the leading edge of said set signal and is reset responsive to said reset signal in preference to said set signal.

According to the present invention, a set signal is applied through a field effect switching device to a set input terminal of a flip-flop, and a capacitance is formed at the gate electrode of the field effect switching device such that the field effect switching device is made conductive if and when the capacitance is charged, while the field effect switching device is made non-conductive if and when the capacitance is discharged. The capacitance is charged prior to the set signal and discharged responsive to the reset signal. As a result, the capacitance is precharged prior to a set signal, whereby the field effect switching device is rendered conductive. If and when a set signal is applied in such a situation, the set signal is transferred through the field effect switching device now in conduction to the set terminal of the flip-flop, whereby the flip-flop, is set. If and when a reset signal is received in such a situation, the capacitance is immediately discharged responsive to the reset signal and the field effect switching device is rendered non-conductive, whereby the transfer path of the set signal is disabled and the flip-flop is made irresponsive to the set signal. At the same time, the flip-flop is reset responsive to the reset signal. The capacitance is kept discharged insofar as the reset signal is received, whereby the flip-flop is made irresponsive to the set signal insofar as the reset signal is received. Thus, a flip-flop having a reset preferential function is provided wherein the flip-flop is set responsive to the edge, such as a leading edge, of the set signal and is reset responsive to a reset signal in preference to a set signal.

According to the present invention, such a modified function of a flip-flop can be achieved by the skillful use of a field effect switching device coupled between a set signal source and a set input terminal of the flip-flop and a capacitance formed at the gate electrode of the field effect switching device such that the capacitance is precharged prior to the set signal and is discharged responsive to the reset signal. As a result, a flip-flop having a reset preferential function can be achieved with a simplified circuit configuration and with a decreased number of circuit components such as field effect devices. As a result, the inventive flip-flop having a reset preferential function can be implemented advantageously in an integrated circuit using insulated gate field effect transistors.

A flip-flop having a reset preferential function can be advantageously employed in implementing a phase comparator for detecting the phase difference of two digital signals. Therefore, according to the present invention, a digital type phase comparator can be implemented with a simplified circuit configuration and with a less number of circuit components such as field effect devices. As a result, a digital type phase comparator can be advantageously implemented in an integrated circuit.

The fact that a flip-flop having a reset preferential function and a digital type phase comparator can be implemented with a less number of circuit components such as field effect devices enhances the scale of integration and the speed of operation when such a flip-flop and phase comparator are implemented in an integrated circuit.

Therefore, a principal object of the present invention is to provide a flip-flop which is set responsive to the edge of the set signal and is reset responsive to the reset signal in preference to a set signal and which is implemented with a less number of circuit components.

Another object of the present invention is to provide a flip-flop having a modified function of being reset responsive to a reset signal in preference to a set signal, which is suited for implementation in an integrated circuit using field effect devices.

A further object of the present invention is to provide a flip-flop having a modified function of being reset responsive to a reset signal in preference to a set signal, implemented in an integrated circuit using field effect devices, wherein the speed of operation is enhanced.

Still a further object of the present invention is to provide a phase comparator for detecting the phase difference between two digital signals, implemented with paired flip-flops having a modified function of being reset responsive to a reset signal in preference to a set signal, suited for implementation in an integrated circuit.

These objects and other objects, features, aspects and advantages of the present invention will become more apparent from the following detailed description of the present invention when taken in conjunction with the accompanying drawings.

BRIEF DESCRIPTION OF THE DRAWINGS

In the drawings, like portions are denoted by like reference characters.

DESCRIPTION OF THE PREFERRED EMBODIMENTS

Figure 10:
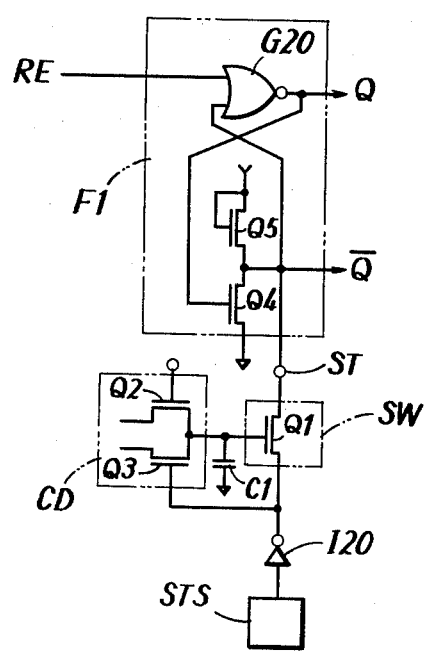
FIG. 10 shows a schematic diagram showing a basic idea of the inventive flipflop.

FIG. 10 shows a schematic diagram showing a basic idea of the inventive flip-flop. Referring to FIG. 10, the inventive flip-flop comprises a flip-flop unit F1 having set and reset input terminals ST and RE, and set and reset output terminals Q and $\overline{Q}$. The flip-flop unit F1 is shown implemented by a cross connection of a NOR gate G20 and an inverter comprising a switching field effect transistor Q4 and a load field effect transistor Q5. More specifically, one input of the NOR gate G20 is connected to the reset input terminal RE. Another input of the NOR gate G20 is connected to the junction of the field effect transistors Q4 and Q5. The junction of the field effect transistors Q4 and Q5 is also connected to the set input terminal ST and the reset output terminal $\overline{Q}$. The output of the NOR gate G20 is connected to the set output terminal Q and is also connected to the gate electrode of the field effect transistor Q4. The series connection of the field effect transistors Q5 and Q4 is connected between the voltage source VDD and the ground. The gate electrode of the field effect transistor Q5 is connected to the voltage source. As well known, the field effect transistor Q5 serves as a load resistor, while the field effect transistor Q4 serves as a switching device. The set input terminal ST is coupled through another field effect transistor Q1 serving as a switching device SW to the output of an inverter I20. The input of the inverter I20 is connected to a set signal source STS, such as a clock signal source. A capacitor C1 is formed at the gate electrode of the field effect transistor Q1. The capacitor C1 may be a stray capacitance normally formed at the gate electrode of the field effect transistor Q1. Alternatively, a capacitance may be formed between the ground and the gate electrode of the field effect transistor Q1 in addition to a stray capacitance formed at the gate electrode of the field effect transistor Q1. The gate electrode of the field effect transistor Q1, i.e. one terminal of the capacitance C1 is coupled to a charging/discharging control circuit CD. The charging/discharging control circuit CD comprises a discharge control field effect switching transistor Q2, the gate electrode of which is connected to the reset input terminal RE and a charge control field effect switching transistor Q3, the gate electrode of which is connected to the output of the inverter I20.

According to the principle of the present invention, a set signal such as a clock signal is applied through a field effect switching device SW to the set input terminal ST of the flip-flop F1 by way of a set input signal, and a capacitance is formed at the gate electrode of the field effect switching device SW, which capacitance is adapted to be precharged prior to a set signal and is adapted to be discharged responsive to the reset signal. Therefore, the field effect switching device SW is rendered conductive prior to the set signal and is rendered non-conductive responsive to the reset signal. Therefore, the set signal obtainable from the set signal source STS in the form of a clock signal is transferred to the set terminal of the flip-flop 1 as a function of the conduction state of the field effect switching device SW. Since the field effect switching device SW is rendered conductive prior to the set signal, if and when the set signal is obtained from the set signal source STS in the form of a clock signal, the set signal is applied through the field effect switching device SW now in conduction to the set input terminal ST of the flip-flop F1. As a result, the flip-flop is set. If and when a reset input signal is received in such a situation, the capacitance C1 is discharged through the charging/discharging circuit CD and the field effect switching device SW is rendered non-conductive, which makes the flip-flop irresponsive to the set signal. The reset input signal is also applied to the flip-flop unit F1, whereby the flip-flop unit F1 is reset. The capacitance C1 is kept discharged insofar as the reset signal RE is received, which keeps the switching device SW rendered non-conductive and hence keeps the flip-flop unit F1 irresponsive to the set signal. As a result, a function of the flip-flop being reset responsive to the reset signal in preference to the set signal can be achieved. On the other hand, the capacitance C1 is charged only if and when neither the reset signal nor the set signal is received, thereby to render the switching device SW conductive. The flip-flop unit F1 is set only if and when the set signal is received in such a situation. This fact makes the inventive flip-flop responsive to the leading edge of the set signal.

Since in the foregoing the principle of the present invention was described with reference to FIG. 10, the operation of the FIG. 10 diagram will be described in more detail. To that end, it is assumed that the field effect transistors are of an N channel enhancement type. If and when neither the set signal nor the reset signal is received, the output from the inverter I20 becomes the high level and the field effect transistor Q3 is rendered conductive. As a result the capacitance C1 is precharged. Accordingly, the field effect transistor Q1 is rendered conductive. However, the high level output of the inverter I20 applied through the field effect transistor Q1 to the input terminal ST does not cause the flip-flop unit F1 to be set, since the high level input at the set input terminal ST and the low level input at the reset input terminal RE causes the NOR gate G20 to provide the low level output, which makes the field effect transistor Q4 non-conductive and the reset output $\overline{Q}$ be the high level, which means the flip-flop unit F1 is reset. If and when the set signal is obtained from the set signal source STS in such a situation, the output of the inverter I20 becomes the low level and hence the field effect transistor Q3 is rendered non-conductive. However, the field effect tranistor Q1 is kept rendered conductive because of the electric charge stored in the capacitance C1. The low level output of the inverter I20 is therefore transferred through the field effect transistor Q1 to the set input terminal ST, whereby the NOR gate G20 is caused to provide the high level output, which makes the field effect transistor Q4 conductive and the reset output terminal $\overline{Q}$ in the low level. Thus, the flip-flop unit F1 is set responsive to the leading edge of the set signal. If and when a reset signal is received in such a situation, the field effect transistor Q2 is rendered conductive and the capacitance C1 is immediately discharged. As a result, the field effect transistor Q1 is rendered non-conductive, which interrupts the transfer path of the set signal from the set signal source STS to the set input terminal ST, thereby to make the flip-flop unit F1 irresponsive to the set input signal insofar as the capacitance C1 is kept discharged. At the same time the reset signal of the high level is applied to the NOR gate G20, another input of which is the high level in such a situation. As a result, the output of the NOR gate G20 becomes the low level, which makes the field effect transistor Q4 non-conductive and makes the reset output terminal $\overline{Q}$ in the high level. Thus, the flip-flop unit F1 is reset. Since the capacitance C1 has been discharged and the field effect transistor Q1 has been rendered non-conductive in such a situation, the flip-flop unit F1 is reset responsive to the reset signal in preference to the set signal.

Figure 11:
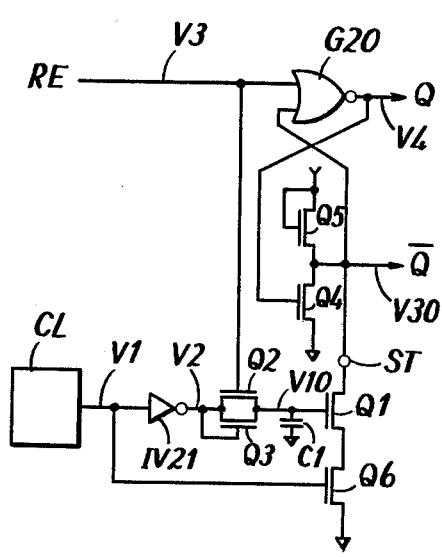
FIG. 11 shows a schematic diagram of one embodiment of the present invention.
Figure 12:
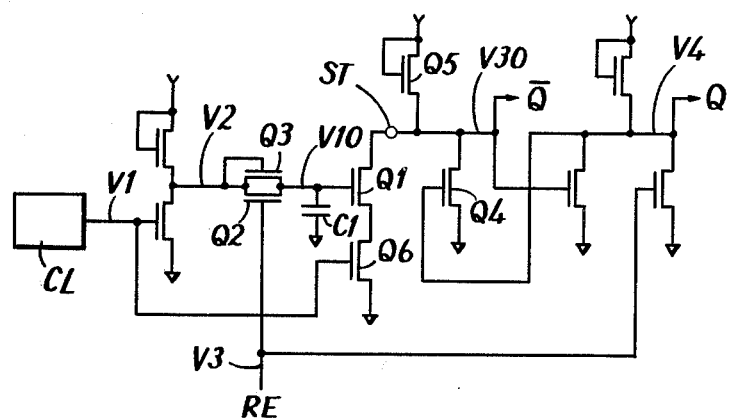
FIG. 12 shows a schematic diagram showing in more detail the FIG. 11 embodiment.

FIG. 11 shows a schematic diagram of one embodiment of the present invention and FIG. 12 shows a schematic diagram showing in more detail the FIG. 11 embodiment. It is pointed out that in the embodiment shown N channel enhancement insulated gate field effect transistors have been employed. In FIGS. 11 and 12, the reference characters ST, RE, Q, $\overline{Q}$, G20, Q1, Q2, Q3, Q4, Q5, Q6 and CL have been used to denote the corresponding portions as discussed with reference to FIG. 10. The field effect transistor Q1 is connected through another field effect transistor Q6 to the ground in the FIGS. 11 and 12 embodiment, the set signal source STS is referred to as a clock signal source CL. The output of the clock signal is directly connected to the gate electrode of the field effect transistor Q6. The output of the clock signal source CL is also connected to an inverter IV21, the output of which is connected to the field effect transistors Q2 and Q3. The gate electrode of the field effect transistor Q3 is connected to the output of the inverter IV21. The circuit connection of the other portions is the same as that shown in FIG. 10. The output of the clock signal source CL is denoted as V1, the inverted output of the inverter IV21 is denoted as V2, the voltage at the capacitance C1 is denoted as V10, the output from the set output terminal Q is denoted as V4, and the output from the reset output terminal Q is denoted as V30.

Figure 13:
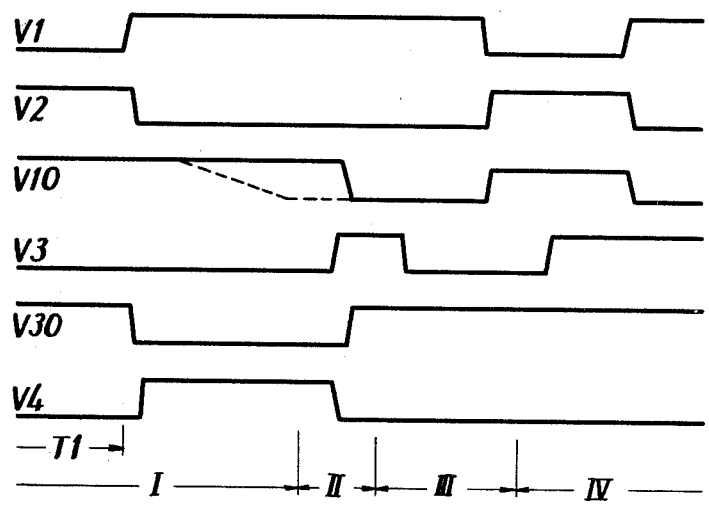
FIG. 13 shows wave forms of the signals at various portion in the FIG. 12 embodiment.

The operation of the FIGS. 11 and 12 embodiment can be better understood with reference to FIG. 13, which shows wave forms of the signals denoted as V1, V2, V10, V3, V30 and V4 in the foregoing. Referring to FIG. 13, the operation time period has been divided into several phase times as denoted as T1, I, II, III and IV for facility of explanation.

In operation, during the phase time as denoted as T1, the voltage level V1 of the clock signal is the low level, and accordingly the inverted voltage level V2 is the high level. Therefore, the field effect transistor Q3 is rendered conductive and the capacitance C1 is precharged. Accordingly, the voltage level V10 across the capacitance C1 is also the high levle. At that time, the voltage level V3 at the reset input terminal RE is a low level and accordingly the field effect transistor Q2 is rendered non-conductive. Let it be assumed that the voltage level V4 at the reset output terminal Q is the low level and the voltage level V30 at the reset output terminal $\overline{Q}$ is the high level, i.e. the flip-flop unit F1 has been reset. If and when a clock signal is obtained from the clock signal source CL, the voltage level V1 becomes the high level and the voltage level V2 becomes the low level. As a result, the field effect transistor Q3 is rendered non-conductive. As a result, the electric charge as stored in the capacitance C1 is kept stored and the voltage level V10 is maintained in the high level for the time being. Depending on the case, the voltage level V10 could gradually decrease as shown in the dotted line, because of a leakage current with the lapse of time. Since the voltage level V1 becomes the high level while the voltage level V10 is in the high level, both the field effect transistors Q1 and Q6 become conductive. As a result, the voltge level V30 becomes the low level and accordingly the voltage level V4 becomes the high level. The flip-flop unit F1 is thus set responsive to the leading edge of the clock signal.

Referring to the time period II, if and when the reset signal is received in such a situation, the voltage level V3 turns from the low level to the high level, whereby the field effect transistor Q2 is rendered conductive and the electric charge stored in the capacitance C1 is discharged, with the result that the voltage level V10 across the capacitance C1 turns from the high level to the low level. As a result, the field effect transistor Q1 is rendered non-conductive. Since the voltage level V3 has become the high level, the voltage level V4 of the set output Q becomes the low level and the voltage level V30 of the reset output $\overline{Q}$ becomes the high level. This means that the flip-flop unit F1 is reset responsive to the reset signal.

Referring to the time period III, even if the voltage level V3 of the reset signal becomes the low level in such a situation, i.e. the reset signal is interrupted, the voltage level V4 of the set output Q remains the low level, unless the leading edge of the clock signal, i.e. the rise portion of the voltage level V1 is again encountered, and accordingly the voltage level V30 of the reset output $\overline{Q}$ remains the high level. If and when the clock signal is interrupted and the voltage level V1 becomes the low level, the voltage level of the set output Q remains the low level and the voltage level V30 of the reset output $\overline{Q}$ remains the high level, while the voltage level V2 becomes the high level and the field effect transistor Q3 is rendered conductive, whereby the capacitance C1 is again charged to regain the state as discussed as in the time period T1.

Referring to the time period IV, if and when the reset signal is received and the voltage level V3 becomes the high level in such a situation, no changes occurs in the storing state of the flip-flop unit F1, inasmuch as the flip-flop unit F1 has been reset. In such a situation, the voltage level V1 of the clock signal has been the low level and the voltage level V4 of the set output Q has been the low level. Accordingly, the field effect transistors Q6 and Q4 are rendered non-conductive, and the voltage level V30 of the reset output $\overline{Q}$ is th high level and the voltage levels V2 and V10 have also been the high level. If and when the clock signal is received and the voltage level V1 becomes the high level in such a situation, the field effect transistor Q6 is rendered conductive. However, the field effect transistor Q2 has been rendered conductive because of the high level of the voltage level V3. Therefore, as soon as the voltage level V2 becomes the low level, the voltage level V10 across the capacitance C1 also becomes the low level, whereby the field effect transistor Q1 is rendered non-conductive. On the other hand, the field effect transistor Q4 is kept non-conductive. Therefore, the voltage level V30 of the reset output Q does not become the high level and the voltage level 4 of the set output Q does not become the low level. This means that the flip-flop unit F1 is kept reset irrespective of the leading edge of the clock signal, i.e. the flip-flop unit F1 is kept reset, insofar as the reset signal is received, in preference to the leading edge of the clock signal.

Figure 1:
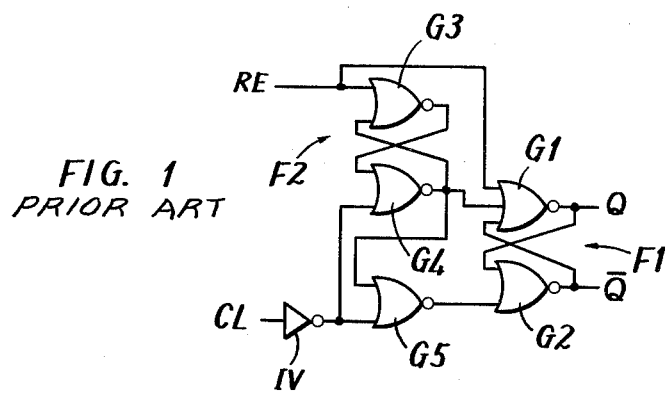
FIG. 1 shows a logical diagram of an example of a flip-flop having a reset preferential function.
Figure 2:
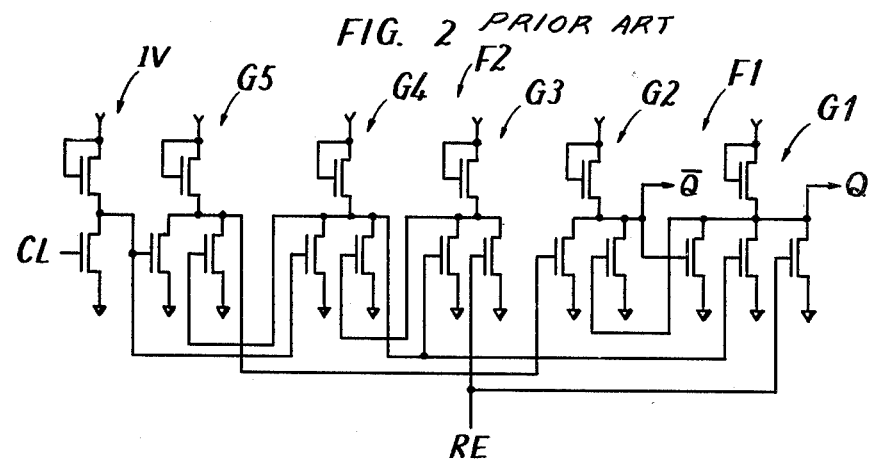
FIG. 2 shows a schematic diagram of the FIG. 1 flip-flop implemented by an integrated circuit comprising insulated gate field effect transistors.
Figure 3:
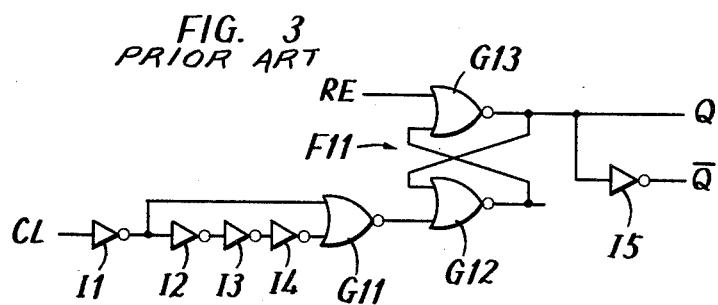
FIG. 3 shows a logical diagram of another exmaple of a flip-flop having a reset preferential function.
Figure 4:
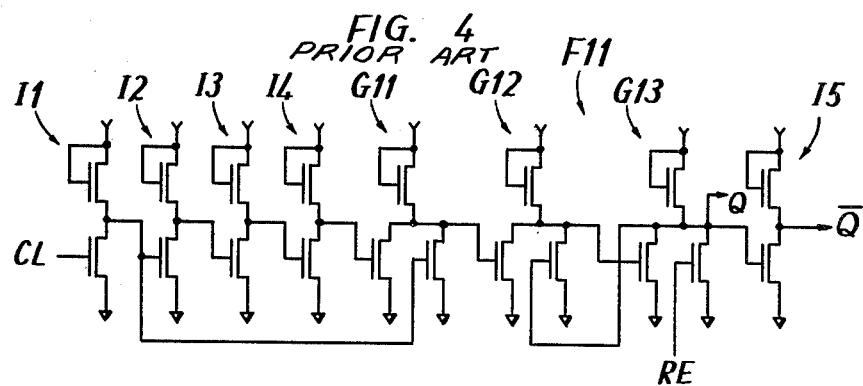
FIG. 4 shows a schematic diagram showing the FIG. 3 flip-flop in more detail.
Figure 5:
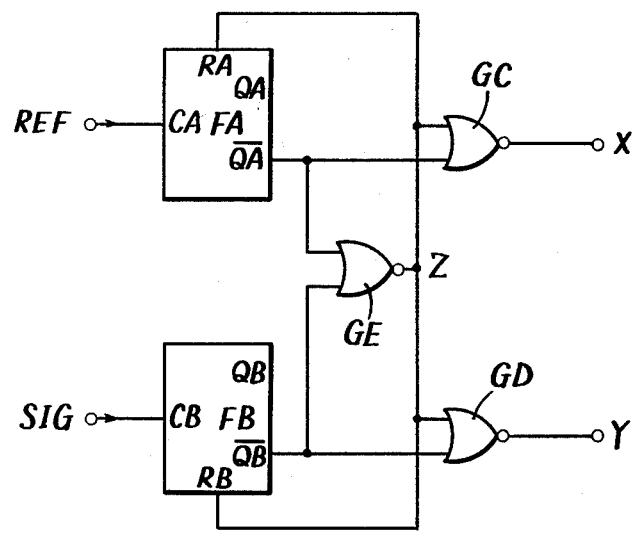
FIG. 5 shows a block diagram of an example of a conventional digital type phase comparator employing flip-flops having a reset preferential function.
Figure 6:
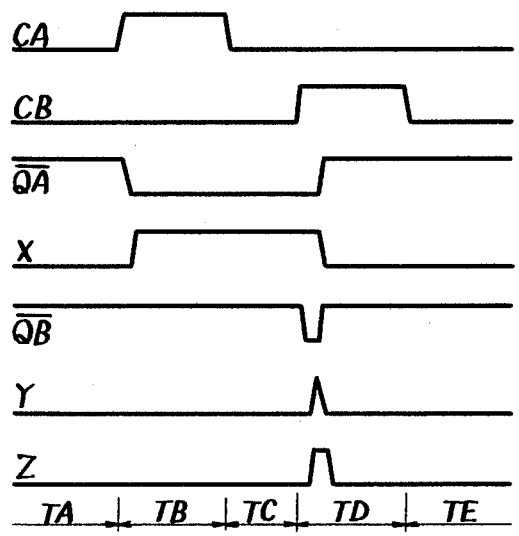
FIG. 6 shows wave forms of the signals at various portions in the FIG. 5 diagram.
Figure 7:
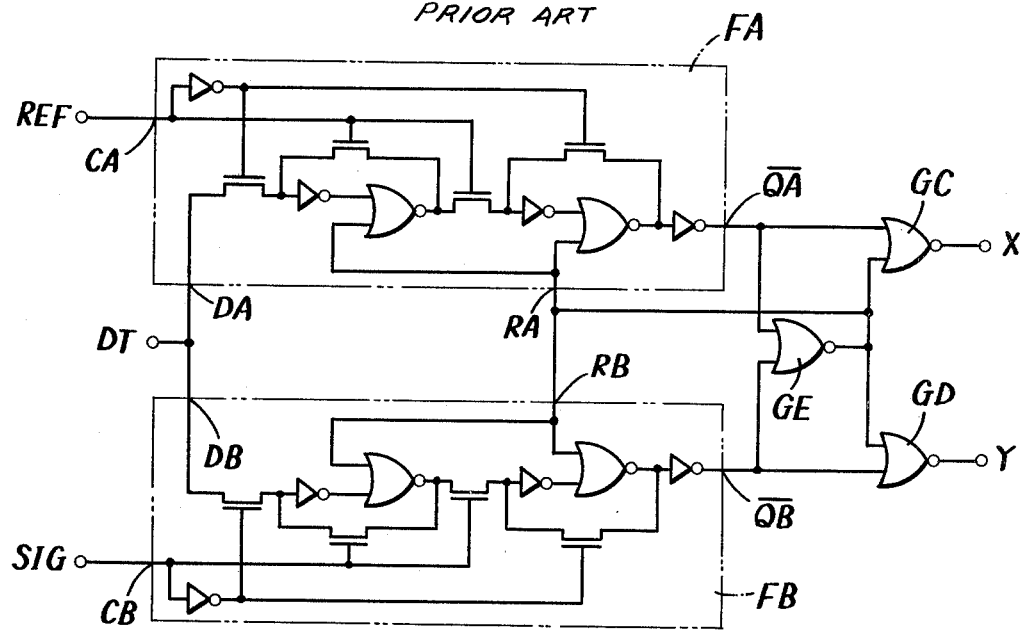
FIG. 7 shows a schematic diagram of the FIG. 5 phase comparator.
Figure 8:
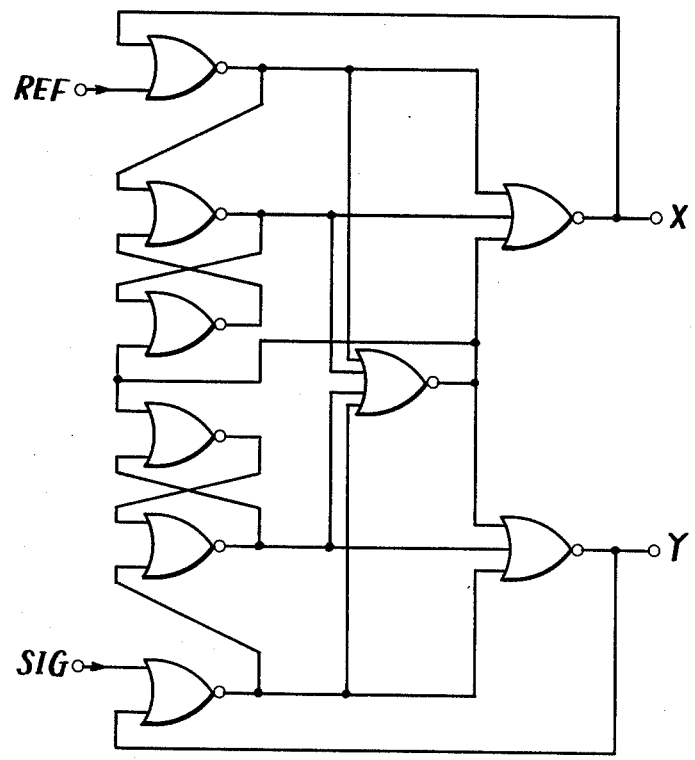
FIG. 8 shows a logical diagram of another conventional digital type phase comparator of interest.

In comparison of the FIG. 12 embodiment of the present invention with the FIG. 2 example of the prior art flip-flop, the number of field effect devices used in the flip-flop has been decreased from the number of 18 in the FIG. 2 example to the number of 11 in the FIG. 12 embodiment of the present invention. In addition to the decrease in the number of field effect transistors employed in the flip-flops, the invention flip-flop has a decreased number of stages from the clock signal source to the last stage of the flip-flop, as compared with that in the FIG. 2 example. Thus, according to the present invention, the number of field effect transistors can be decreased by about 40% and the circuit configuration can be simplified. Hence, if the inventive flip-flop is implemented in an integrated circuit, the scale of integration can be enhanced. In addition, the time required from the rise of the clock signal to the output of the data signal can be reduced by about a half. Hence, the speed of operation can also be enhanced.

Figure 14:
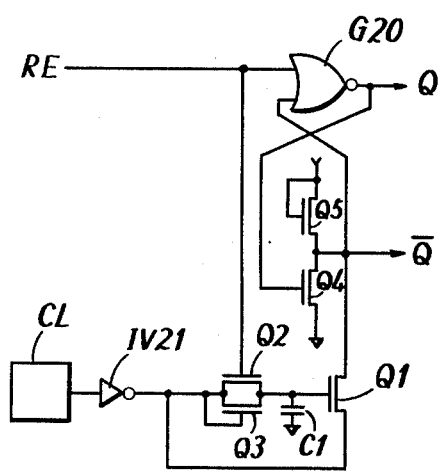
FIGS. 14 through 18 show schematic diagrams of various modifications of the present invention.
Figure 16:
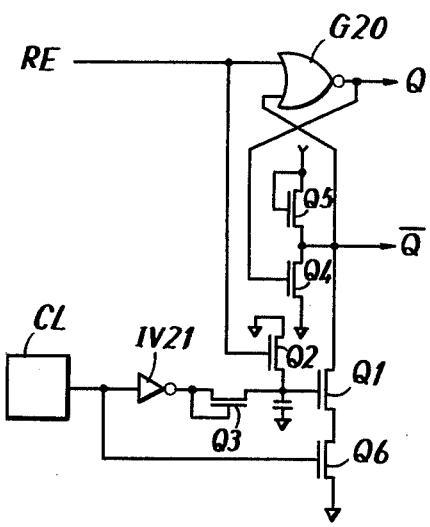
Figure 15:
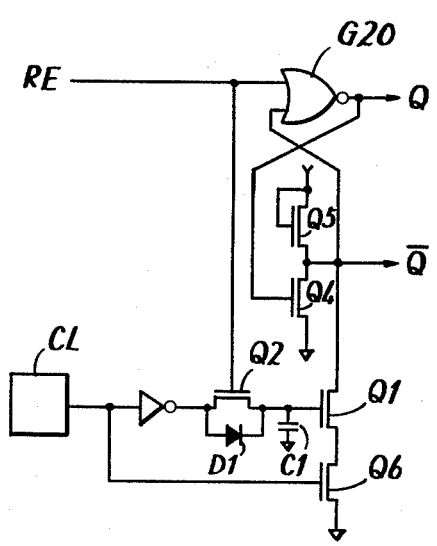
Figure 17:
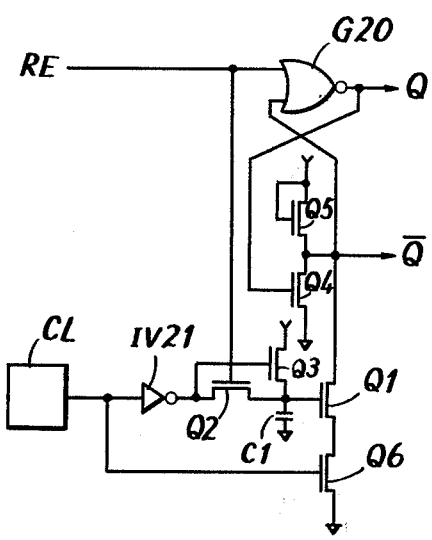
Figure 18:
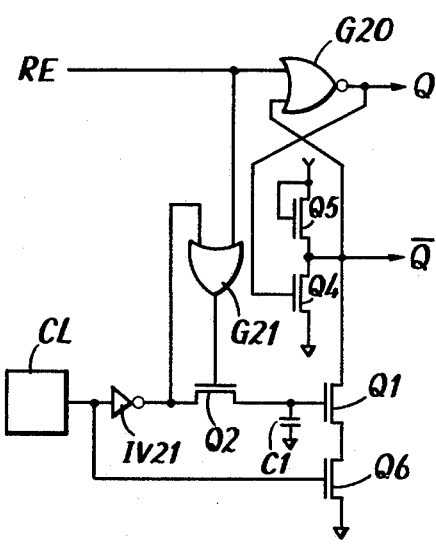

FIGS. 14 through 18 show schematic diagrams of various modifications of the present invention. In these modifications, the corresponding portions have been denoted by the same reference characters. Referring to FIG. 14, the field effect transistor Q1 has been directly coupled to the output of the invertor IV21, whereby the field effect transistor Q6 has been omitted, inasmuch as the same logical state signal is obtained from the output of the invertor IV21 to the field effect transistor Q1. Referring to FIG. 15, the field effect transistor Q3 has been replaced by a diode D1 connected from the invertor IV21 to the capacitor C1 in the forward direction, inasmuch as the field effect transistor Q3 the gate electrode of which is connected to the output of the invertor IV21 is equivalent to the diode D1 in terms of the operation. Referring to FIG. 16, the field effect transistor Q2 is connected from the capacitance C1 to the ground instead of being connected to the output of the invertor IV21. Referring to FIG. 17, the field effect transistor Q3 is connected from the capacitance C1 to the voltage source instead of being connected to the output of the invertor IV21. Referring to FIG. 18, a parallel connection of the fielf effect transistors Q2 and Q3 has been replaced by a single field effect transistor Q2, the gate electrode of which is connected to the output of an OR gate G21 which is connected to receive the reset signal and the output of the invertor IV21, inasmuch as the connection of the field effect transistors Q2 and Q3 in the FIG. 11 is in terms of a logic equivalent to a combination of the OR gate G21 and a single field effect transistor Q2 in the FIG. 18 embodiment.

As briefly described previously, the capacitance C1 may be a stray capacitance normally formed at the gate electrode of the field effect transistor Q1. Alternatively, an additional capacitance may be purposely formed in addition to the above described stray capacitance, be properly providing a capacitance plate, as well known to those skilled in the art. It is intended that the present invention covers both cases. It is further pointed out that although the present invention has been described as implemented using N channel insulated gate field effect transistors the same can be implemented using any types of field effect transistors, such as P channel insulated gate field effect transistors, complementary metal oxide semiconductor field effect transistors including a combination of N and P channel field effect transistors, and junction field effect transistors, Schottky junction type field effect transistors, and the like.

Figure 19:
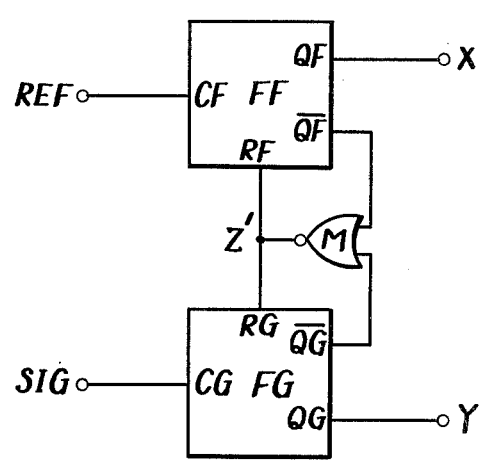
FIG. 19 shows a block diagram of a digital phase comparator employing the inventive flip-flop having a reset preferential function.

A flip-flop having a reset preferential function as described in the foregoing can be advantageously utilized in implementing a digital type phase comparator for detecting the phase difference between two digital input signals. FIG. 19 shows a block diagram of a digital phase comparator employing the inventive flip-flop having a reset preferential function. Referring to FIG. 19, the phase comparator shown comprises a pair of the inventive flip-flops FF and FG and a control gate M coupled to the flip-flop FF and FG for generating a reset signal. More specifically, the flip-flops FF and FG are structured such that the flip-flops are set responsive to the leading edge of the clock signals REF and SIG applied to the clock signal input terminals CF and CG and reset responsive to the reset signals applied to the reset input terminals RF and RG in preference to the clock signals. The reset output terminals $\overline{QF}$ and $\overline{QG}$ are connected to the inputs of the control gate implemented by a NOR gate M. The output of the NOR gate M is applied to the reset input terminals RF and RG as a reset signal. The clock signal input terminal CF is supplied with a reference signal and the clock signal input terminal CG is supplied with the signal being compared. The set output terminals QF and QG are connected to the output terminals X and Y for withdrawing the output signals representative of the phase difference between the leading edges of the reference signal and the signal being compared.

Figure 20:
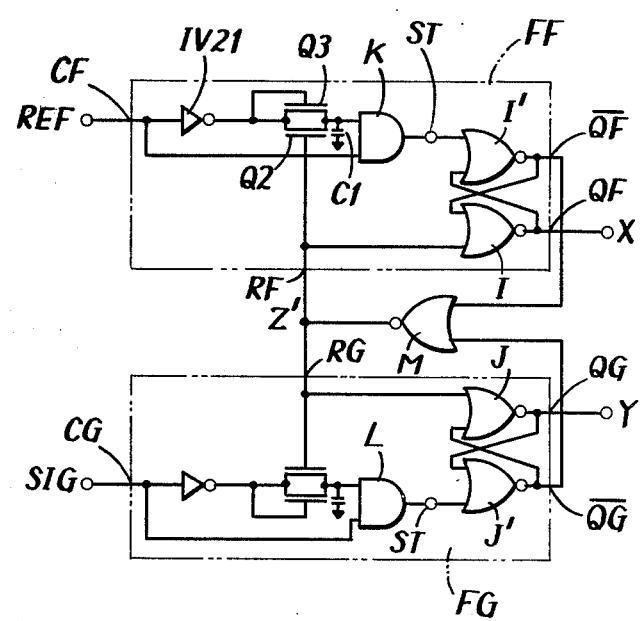
FIG. 20 shows a schematic diagram of the FIG. 19 embodiment.

FIG. 20 shows a schematic diagram of the FIG. 19 embodiment, wherein each of the flip-flops FF and FG has been shown in more detail. The corresponding portions in the FIG. 20 embodiment have been denoted by the same reference characters. The flip-flops FF and FG are shown employing a circuit configuration similar to the FIG. 11 embodiment. In the FIG. 20 diagram, however, a series connection of the insulated gate field effect transistors Q1 and Q6 has been replaced by and AND gate K or L and the flip-flop unit F1 is shown as implemented by a cross connection of paired NOR gates I' and I, or paired NOR gates J' and J. The NOR gates I and J have been structured such that a decision level for determining the high level has been selected to be as low as 1.2 V. The output from the NOR gate M is denoted as the voltage level Z'.

Figure 21:
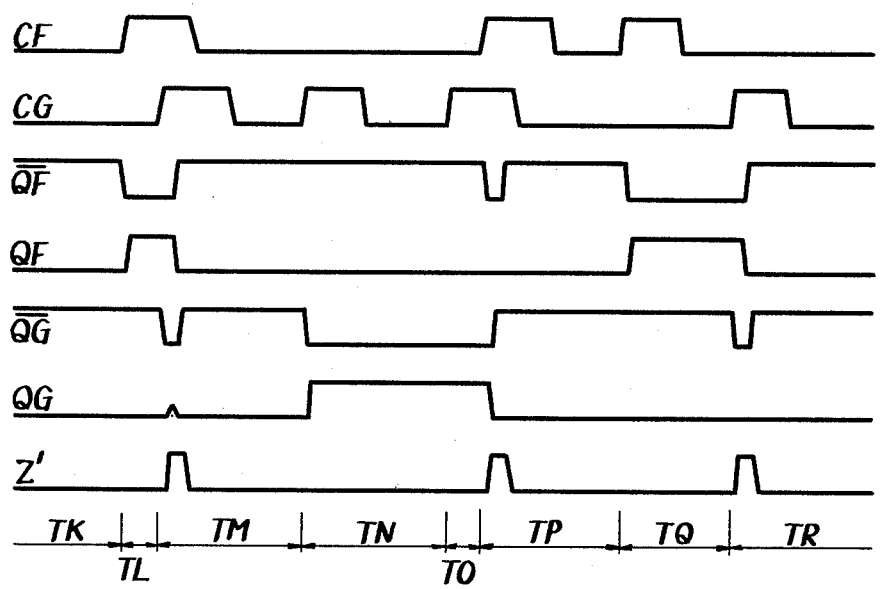
FIG. 21 shows wave forms of the signals at various portions in the FIG. 20 embodiment.

The operation of the FIG. 20 embodiment can be better understood with reference to FIG. 21, which shows wave forms of the signals at various portions in the FIG. 20 embodiment, as identified as the reference characters at the left end of the wave forms. Referring to FIG. 21, the time period shown has been divided into several phase time periods as identified at the bottom of the figure for facility of explanation.

Referring to FIG. 21, particularly to the phase period TK, first let it be assumed that the reference signal CF and the signal being compared CG are both the low level, the set outputs QF and QG both are also the low level, and the reset outputs $\overline{QF}$ and $\overline{QG}$ both are the high level, while the reset signal Z' is the low level. Assuming the reference signal CF becomes the high level in the phase period PL, the flip-flop FF is set and the set output QF turns from the low level to the high level and the reset output $\overline{QF}$ turns from the high level to the low level. Further assuming that the signal being compared CG becomes the high level in the phase time period TM, the flip-flop FG is also set, whereby the reset output $\overline{QG}$ of the flip-flop FG is about to turn from the high level to the low level, which is about to cause the output Z' of the NOR gate M to turn from the low level to the high level. However, a decision level for determining the high level of the NOR gate J has been selected to be as low as 1.2 V, as described previously. Therefore, the set output $\overline{QG}$ of the flip-flop FG remains the low level until the reset output QG of the flip-flop FG becomes lower than 1.2 V. Since in such a transient period the output Z' of the NOR gate M exceeds 1.2 V, the NOR gate J comes to receive a reset signal, which causes the NOR gate J to provide the low level output. Even if the reset output $\overline{QG}$ of the flip-flop FG has become the low level, the set output QG of the flip-flop FG does not become the high level. In other words, little pulsive signal is obtained in such a transient period. Since the output Z' of the NOR gate M turns from the low level to the high level, the reset output $\overline{QG}$ of the flip-flop FG returns from the low level to the high level and accordingly the set output QF of the flip-flop FF also returns from the high level to the low level. Since the reset output $\overline{QG}$ of the flip-flop FG returns to the high level, the output Z' of the NOR gate M returns from the high level to the low level. Since the set output QF of the flip-flop FF turns from the high level to the low level, the reset output $\overline{QF}$ of the flip-flop FF turns from the low level to the high level. As a result, the set output terminal $\overline{QF}$ of the flip-flop FF provides a pulse signal representative of the phase difference between the leading edge of the reference signal CF and the signal being compared CG. This means that the FIG. 20 embodiment serves as a digital phase comparator for detecting the phase difference between the leading edges of two digital input signals.

Referring again to FIG. 21, thereafter the reference signal CF turns from the high level to the low level and subsequently the signal being compared CG turns from the high level to the low level. However, no change occurs in the storing state of the flip-flops FF and FG. Referring to the phase period TN, let it be assumed that the signal being compared CG first turns from the low level to the high level. Then, the flip-flop FG is first set and the set output QG turns from the low level to the high level and the reset output $\overline{QG}$ turns from the high level to the low level. Thereafter the signal being compared CG returns from the high level to the low level. However, this does not cause any change in the storing state of the flip-flops FF and FG. The signal being compared CG again changes from the low level to the high level at the phase time period TO. However, since the flip-flop FG has been set and the set output QG has turned to the high level and the reset output $\overline{QG}$ has turned to the low level, no change occurs in the storing state of the flip-flops FF and FG. Referring to the phase period TP, if and when the reference signal CF turns from the low level to the high level in such a situation, the reset output $\overline{QF}$ of the flip-flop FF is about to turn from the high level to the low level, and the output Z' of the NOR gate N is about to turn from the low level to the high level and at the same time the set output QF of the flip-flop FF is about to turn from the low level to the high level. However, the decision level for determining the high level of the NOR gate I has been selected to be as low as 1.2 V. Therefore, the set output QF of the flip-flop FF remains the low level until the reset output $\overline{QF}$ of the flip-flop FF becomes lower than 1.2 V. Since in such a transient period the output Z' of the NOR gate M comes to exceed 1.2 V, the NOR gate I receives a reset signal to provide the low level output. Even if the reset output $\overline{QF}$ of the flip-flop had become fully to the low level thereafter, the set ouput QF of the flip-flop FF does not become the high level. Thus, in this case again, little pulsive signal is obtained from the set output QF of the flip-flop FF. Since the output Z' of the NOR gate M turns from the low level to the high level, the reset output $\overline{QF}$ of the flip-flop FF returns from the low level to the high level and the set output QG of the flip-flop FG turns from the high level to the low level. Since the set output $\overline{QF}$ of the flip-flop FF returns to the high level, the output Z' of the NOR gate M returns from the high level to the low level. Since the set output QG of the flip-flop FG turns from the high level to the low level, the reset output of the flip-flop FG turns from the low level to the high level. Thus the set output QG of the flip-flop FG provides a pulse signal representing the phase difference between the leading edges of the signal being compared CG and the reference signal CF. A pulse signal is obtained from the set output terminal QG of the flip-flop FG when the signal being compared CG becomes of a higher frequency than that of the reference signal CF. Thereafter the signal being compared CG turns from the high level to the low level and the reference signal CF turns from the high level to the low level, although no change occurs in the storing state of the flip-flops FF and FG responsive to such level change of the signals.

Referring to the phase period TQ, the reference signal CF becomes the high level and the reset output $\overline{QF}$ of the flip-flop FF turns from the high level to the low level, while the set output QF of the flip-flop FF turns from the low level to the high level. Thereafter the reference signal CF returns from the high level to the low level, although no change occurs in the storing state of the flip-flop FF. Referring to the phase period TR, the signal being compared CG turns from the low level to the high level in such a situation and the reset output $\overline{QG}$ of the flip-flop FG is about to turn from the high level to the low level and accordingly the output Z' of the NOR gate M is about to turn from the low level to the high level, while the set output QG of the flip-flop FG is about to turn from the low level to the high level. However, since the decision level for determining the high level of the NOR gate J has been selected to be as low as 1.2 V, the set output QG of the flip-flop FG remains in the low level until the reset output QG of the flip-flop FG becomes lower than 1.2 V. In such a transient period, the output Z' of the NOR gate M comes to exceed 1.2 V and the NOR gate J is supplied with a reset signal, thereby to provide the low level output. Even if the reset output $\overline{QG}$ of the flip-flop FG has fully reached the low level, the set output QG of the flip-flop FG does not become the high level. Thus, little pulsive signal is obtained from the set output QG of the flip-flop FG.

Since the output Z' of the NOR gate M turns from the low level to the high level, the reset output $\overline{QG}$ of the flip-flop FG returns from the low level to the high level, while the set output QF of the flip-flop FG turns from the high level to the low level. Since the reset output $\overline{QG}$ of the flip-flop FG returns to the high level, the Z' of the NOR gate M returns from the high level to the low level. Since the set output QF of the flip-flop FF turns from the high level to the low level, the reset output $\overline{QF}$ of the flip-flop FF turns from the low level to the high level. Thus, just like in the phase period TM, a pulse signal is obtained from the set output of the QF of the flip-flop FF which is representative of the phase difference between the leading edge of the reference signal CF applied to the set terminal CF of the flip-flop FF and the leading edge of the signal being compared CG applied to the set terminal CG of the flip-flop FG. Thereafter, the signal being compared CG turns from the high level to the low level, although no change occurs in the storing state of the flip-flops FF and FG.

As apparent from the foregoing description, the digital phase comparator as shown and described enables phase comparison of two digital signals without causing an undesirable pulsive signal which is liable to occur in the transient period.

Figure 9:
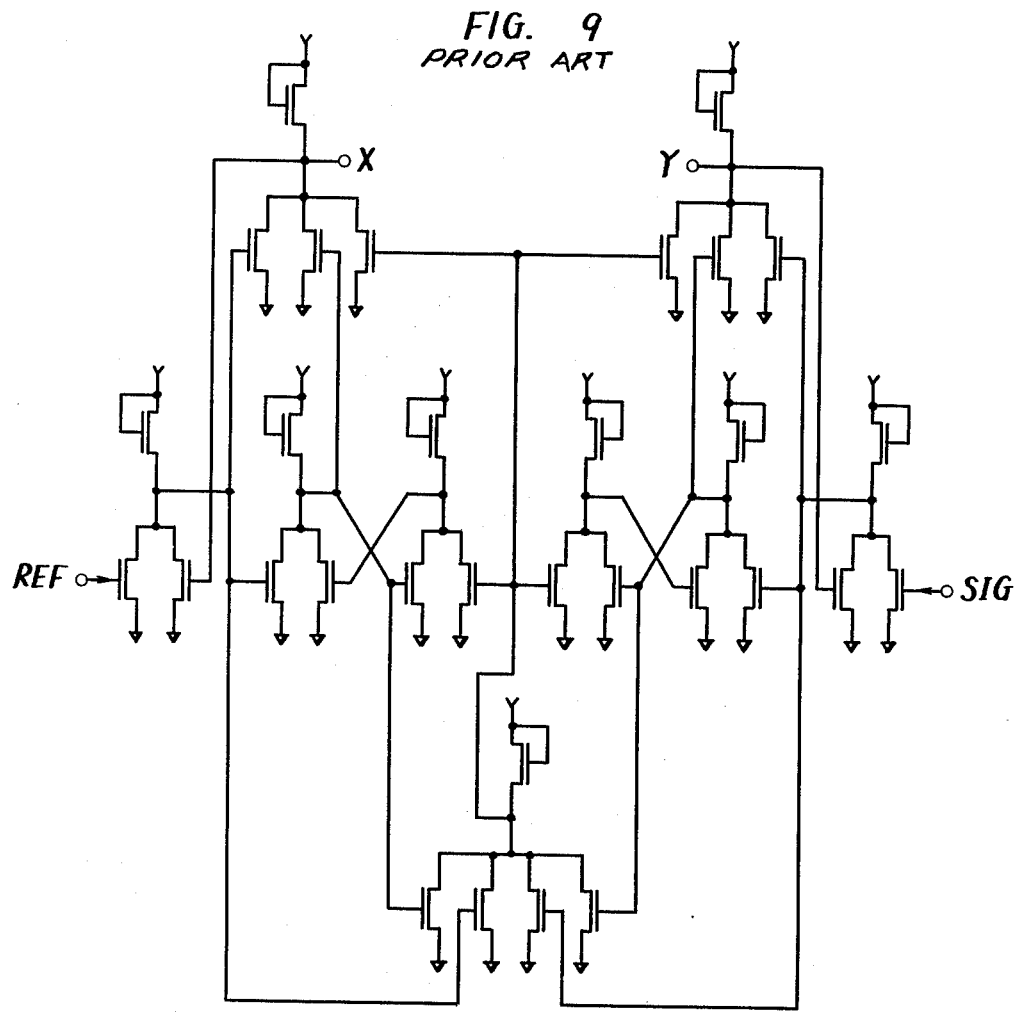
FIG. 9 shows a schematic diagram of the FIG. 8 example implemented in an integrated circuit using insulated gate field effect transistors.
Figure 22:
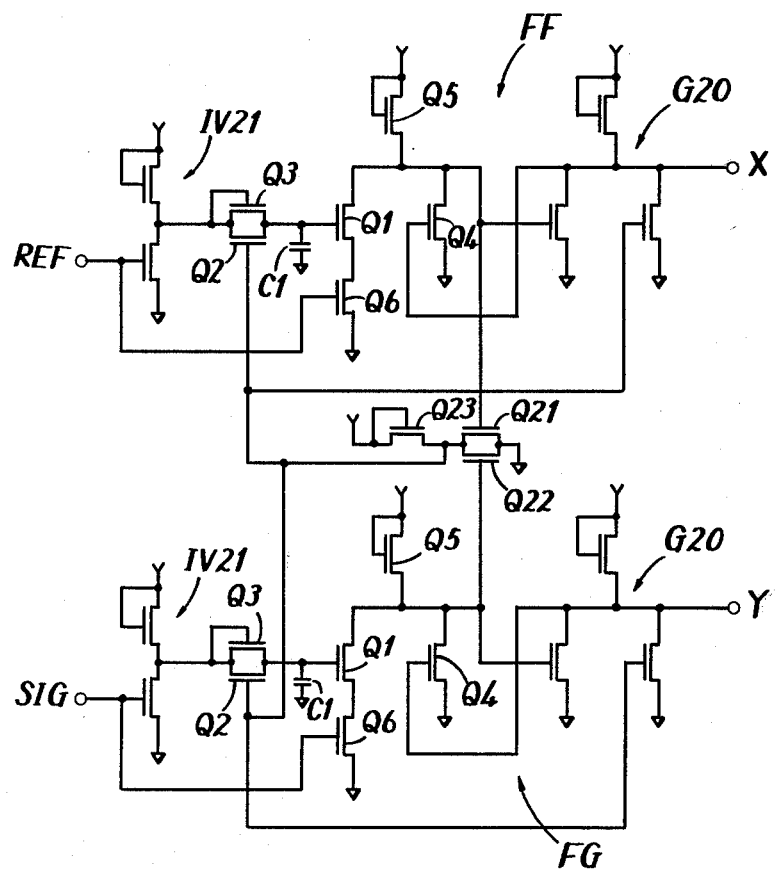
FIG. 22 shows a schematic diagram of the FIG. 20 embodiment.

FIG. 22 shows a schematic diagram of the FIG. 20 embodiment, wherein the corresponding portions have been denoted by the same reference characters. The flip-flops FF and FG have been structured in the same circuit configuration as shown in the FIG. 12 embodiment. The NOR gate M has been implemented by the parallel connection of insulated gate field effect transistors Q21 and Q22, which is connected in series with another insulated gate field effect transistor Q23 connected to serve as a load resistor. In comparison of the FIG. 22 embodiment with the FIG. 9 example, the former can be implemented using 25 field effect transistors, whereas the latter requires 31 field effect transistors. Thus, according to the present invention, a digital type phase comparator can be implemented with a decreased number of insulated gate field effect transistors. This makes it possible to simplify the circuit configuration of a digital type phase comparator, enhance the scale of integration in implementing a phase comparator using field effect transistors and improve the speed of operation. Thus, according to the present invention, a digital type phase comparator suited for implementation in an integrated circuit is provided.

Although the present invention has been described and illustrated in detail, it is to be clearly understood that the same is by way of illustration and example only and is not to be taken by way of limitation, the spirit and scope of the present invention being limited only by the terms appended claims.

What is claimed is:

1. A flip-flop having a set input terminal and a reset input terminal, comprising
   field effect switching means coupled to said set input terminal and having a gate electrode,
   capacitance means formed associated with said gate electrode of said field effect switching means,
   set signal source means coupled through said field effect switching means to said set input terminal for providing a set signal through said field effect switching means to said set input terminal,
   reset signal source means coupled to said reset input terminal for providing a reset signal to said reset input terminal, and
   charging/discharging control means operatively coupled to said set signal source means for precharging said capacitance means prior to said set signal and operatively coupled to said reset signal source means for discharging said capacitance means responsive to said reset signal, said field effect switching means being rendered conductive as a function of the electric charge stored in said capacitance means, whereby said set signal is applied through said field effect switching means to said set input terminal as a function of the conduction state of said field effect switching means.

2. A flip-flop in accordance with claim 1, wherein said charging/discharging control means comprises charging control switching means operatively coupled to said set signal source means for being rendered conductive for precharging said capacitance means prior to said set signal, and discharge control switching means operatively coupled to said reset signal source means for being rendered conductive for discharging said capacitance means responsive to said reset signal.

3. A flip-flop in accordance with claim 2, wherein said charging control switching means and said discharging control switching means are connected to a common potential point.

4. A flip-flop in accordance with claim 2 having a plurality of potential points, wherein said charging control switching means and said discharging control switching means are each connected to a different respective potential point.

5. A flipflop in accordance with claim 2, wherein said charging control switching means comprises field effect means.

6. A flip-flop in accordance with claim 2, wherein said discharging control switching means comprises field effect means.

7. A flip-flop in accordance with claim 2, wherein said discharging control switching means includes a control electrode connected to said reset signal source means.

8. A flip-flop in accordance with claim 2, wherein said charging control switching means is adapted to be conductive responsive to an inversion of said set signal.

9. A flip-flop in accordance with claim 1, wherein said charging/discharging control means comprises a single common switching means.

10. A flip-flop in accordance with claim 4, wherein said charging control switching means is coupled to said set signal source means and said discharging control switching means is coupled to a constant potential point.

11. A flip-flop in accordance with claim 4, wherein said charging control switching means is connected to a constant potential point and said discharging control switching means is coupled to said set signal source means.

12. A flip-flop in accordance with claim 1, wherein said capacitance means comprises an additional capacitor formed separately from an inherent stray capacitance formed at the gate electrode of said field effect switching means.

13. A flip-flop in accordance with claim 1, wherein said capacitance means comprises an inherent capacitance formed at the gate electrode of said field effect switching means.

14. A flip-flop in accordance with claim 1, wherein said set signal source means comprises clock signal source means for generating a clock signal and switching means controllable responsive to said clock signal and connected between said field effect switching means and a constant potential point.

15. A flip-flop in accordance with claim 1, wherein said flip-flop comprises a first flip-flop and second flip-flop, each having a set output terminal and a reset output terminal, and logical gate means is provided for receiving the reset output of said first flip-flop and the reset output of said second flipflop, the output of said logical gate means being applied to the reset input terminals of said first and second flip-flops, the set input terminals of said first and second flipflops being connected to receive two pulse signals the phase difference of which is to be compared.

16. A phase comparator for detecting the phase difference between first and second digital signals, comprising first and second flip-flops corresponding to said first and second digital signals, respectively, each having set and reset input terminals and set and reset output terminals, and logical gate means connected to receive the outputs of the reset output terminals of said first and second flip-flops, the output of said logical gate means being applied to the reset input terminals of said first and second flip-flops each flip-flop comprising field effect switching means coupled to said set input terminal and having a gate electrode, capacitance means formed associated with said gate electrode of said field effect switching means, digital signal source means coupled through said field effect switching means to said set input terminal for providing the corresponding digital signal through said field effect switching means to said set input terminal, and charging/discharging control means operatively coupled to said corresponding digital signal source means for precharging said capacitance means prior to said corresponding digital signal and operatively coupled the output of said logical gate means for discharging said capacitance means responsive to the output of said logical gate means, said field effect switching means being rendered conductive as a function of the electric charge stored in said capacitance means, whereby said corresponding digital signal is applied through said field effect switching means to said set input terminal as a function of the conduction state of said field effect switching means.

17. A flip-flop having at least one output terminal providing a signal defining states of the flip-flop, and at least two input terminals adapted to receive signals for controlling the transfer of said flip-flop to different states, the occurrence of a predefined signal in a preferential one of said input terminals being effective to place said flip-flop in a preferential one of said states, said preferential input terminal overriding the effect of all other input terminals, said flip-flop comprising:

an internal terminal in said flip-flop responsive to the occurrence of a predetermined signal thereon for placing said flip-flop in a state other than said preferential state;

switching means coupled to a nonpreferential one of said input terminals and said internal terminal and having a control electrode responsive to the voltage level thereon to control the conductive condition of said switching means depending on the level of said voltage;

capacitance means formed associated with said control electrode of said switching means; and charging/discharging control means operatively coupled to said one nonpreferential input terminal for precharging said capacitance means prior to the occurrence of an actuating signal on said one nonpreferential input terminal and operatively coupled to said preferential input terminal for discharging said capacitance means upon the occurrence of said predefined signal, said switching means being rendered conductive as a function of electric charge stored in said capacitance means, the signal on said nonpreferential input electrode being applied through said switching means to said internal terminal as a function of the conductive condition of said switching means.

18. A flip-flop in accordance with claim 17, wherein said charging/discharging control means comprises:
   charge and control switching means operatively coupled to said one nonpreferential input terminal for being rendered conductive for precharging said capacitance means; and
   discharge control switching means operatively coupled to said preferential input terminal for being rendered conductive for discharging said capacitance means upon the occurrence of said predefined signal.

19. In combination, first and second flip-flops in accordance with claim 17, each having a pair of complementary output terminals, and logic gate means receiving corresponding outputs of each of said flip-flops, the output of said logic gate means being applied to the preferential input terminal of each of said flip-flops, said one preferential input terminal of each of said flip-flops being connected to receive a different pulse signal, the phase difference between which is to be determined.

* * * * *

UNITED STATES PATENT AND TRADEMARK OFFICE
CERTIFICATE OF CORRECTION

PATENT NO. : 4,179,628
DATED : December 18, 1979
INVENTOR(S) : TSUTOMU OHGISHI, ET AL It is certified that error appears in the above-identified patent and that said Letters Patent are hereby corrected as shown below:

Claim 19, line 7 change "preferential" to --non-preferential--.

Signed and Sealed this

Eighth Day of April 1980

[SEAL]

Attest:

SIDNEY A. DIAMOND

Attesting Officer    Commissioner of Patents and Trademarks